(12) United States Patent
Ferrari et al.

(10) Patent No.: US 6,437,418 B1
(45) Date of Patent: Aug. 20, 2002

(54) HIGH QUALITY FACTOR, INTEGRATED INDUCTOR AND PRODUCTION METHOD THEREOF

(75) Inventors: Paolo Ferrari, Gallarate; Armando Manfredi, Corsico; Benedetto Vigna, Potenza, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/170,914

(22) Filed: Oct. 13, 1998

(30) Foreign Application Priority Data

Oct. 23, 1997 (EP) .............................................. 97830536

(51) Int. Cl.[7] .............................................. H01L 29/00
(52) U.S. Cl. ........................ 257/531; 257/522; 257/528
(58) Field of Search ................................. 257/531, 522, 257/276, 724, 528; 333/181, 184; 336/200, 191, 282, 283, 232; 438/619

(56) References Cited

U.S. PATENT DOCUMENTS 5,450,263 A * 9/1995 Desaigoudar et al. ....... 360/110
5,539,241 A * 7/1996 Abidi et al. ................. 257/531
5,825,092 A * 10/1998 Delgado et al. ............. 257/778
6,211,056 B1 * 4/2001 Begley et al. ............... 438/619

FOREIGN PATENT DOCUMENTS

| EP | 0413348 A2 | 2/1991 |
| EP | 0812016 A1 | 12/1997 |
| WO | WO 94/17558 | 8/1994 |

* cited by examiner

*Primary Examiner*—Steven Loke
*Assistant Examiner*—Shouxiang Hu
(74) *Attorney, Agent, or Firm*—Lisa K. Jorgenson; Robert Iannucci; Seed IP Law Group, PLLC

(57) ABSTRACT

The integrated inductor comprises a coil of metal which is formed in the second metal level. The coil is supported by a bracket extending above spaced from a semiconductor material body by an air gap obtained by removing a sacrificial region formed in the first metal level. The bracket is carried by the semiconductor material body through support regions which are arranged peripherally on the bracket and are separated from one another by through apertures which are connected to the air gap. A thick oxide region extends above the semiconductor material body, below the air gap, to reduce the capacitive coupling between the inductor and the semiconductor material body. The inductor thus has a high quality factor, and is produced by a process compatible with present microelectronics processes.

12 Claims, 5 Drawing Sheets

HIGH QUALITY FACTOR, INTEGRATED INDUCTOR AND PRODUCTION METHOD THEREOF

TECHNICAL FIELD

The present invention relates to a high quality factor, integrated inductor and a production method thereof.

BACKGROUND OF THE INVENTION

As is known, inductors are key components of the operating blocks of a radio-frequency circuit. Their critical parameters comprise the inductance value L, the quality factor Q, and the resonance frequency f. Many applications, such as GSM cellular communications systems, require inductors which have inductance L of 1–10 nH, a quality factor Q of at least 10, and a resonance frequency which is far greater than 1 GHz.

Integrated inductors made of aluminum, which have a quality factor Q of 3, can easily be produced by means of standard microelectronics processes. The quality factor Q is however limited by the parasitic capacitance towards the substrate, and by the resistance of the inductor itself. Consequently, it is not possible at present to produce integrated inductors of semiconductor material which have a high quality factor. For applications which have high requirements, discrete inductors external to the integrated silicon device are used.

SUMMARY OF THE INVENTION

An object of the invention is thus to provide an inductor which has a high quality factor.

The present invention provides a high quality factor integrated inductor and production method thereof. In one embodiment of the present invention, the integrated inductor comprises a coil of conductive material wherein said coil is supported by a bracket extending above and spaced from a semiconductor material body by an air gap. The bracket is carried by the semiconductor material body through support regions.

To enable the present invention to be understood, a preferred embodiment is now described, purely by way of non-limiting example, with reference to the attached drawings.

DETAILED DESCRIPTION OF THE INVENTION

Figure 1:
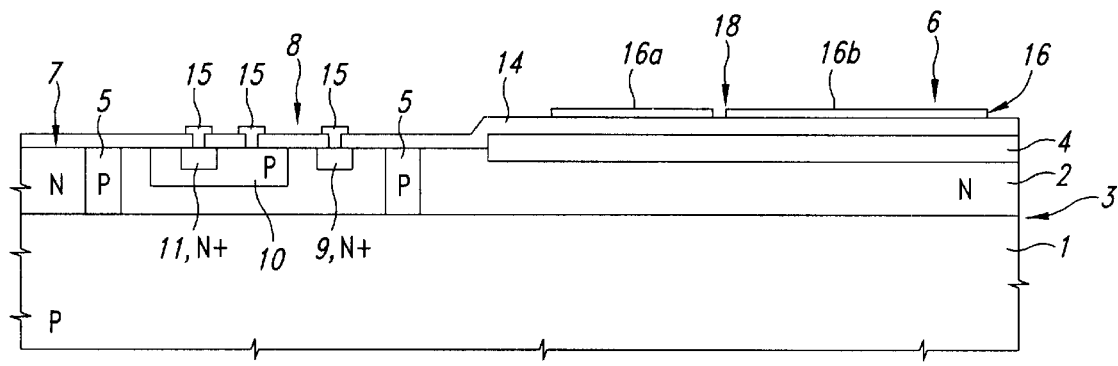
FIG. 1 is a transverse cross-section through a wafer of semiconductor material, in a first production step of the present inductor.

The present production method allows integration of an inductor to form an integrated electronic device of semiconductor material (e.g., silicon) which has electronic components of the MOS or bipolar type. The method begins with production steps known for forming electronic components. Referring to FIG. 1, on a substrate 1 of P-type, an epitaxial layer 2 of N-type is grown, obtaining a semiconductor material wafer 3; across a surface 7 of the epitaxial layer, thick field oxide regions are formed in order to delimit the active areas; in particular, a thick oxide region 4 extends in the area on which the inductor will be formed (inductor area 6). Then, in the epitaxial layer 2, junction isolation regions 5 of P-type are formed, extending from the surface 7 of the epitaxial layer 2 to the substrate 1, and in the epitaxial layer 2, conductive regions necessary for forming electronic components are formed. In particular, FIG. 1 shows an NPN transistor 8, having a collector contact region 9 of $N^+$-type, a base region 10 of P-type, and an emitter region 11 of $N^+$-type.

Figure 2:
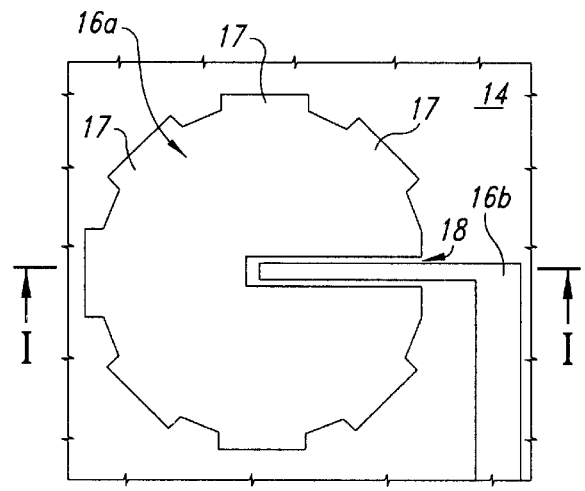
FIG. 2 is a view from above of part of the wafer in FIG. 1.

Subsequently, on the surface 7 of the epitaxial layer, a surface dielectric layer 14 (for example BPSG, Boron Phosphorous Silicon Glass) is deposited, and contacts are opened by means of a masking and selective removing step. Then, a first metal layer is deposited and defined, comprising for example aluminum-silicon, or aluminum-silicon-copper; thereby contact electrodes 15 for the components, and, in the inductor area 6, a sacrificial region 16a and a first connection line 16b are formed, region 16a and line 16b extending above the thick oxide region 4. Thus, the intermediate structure of FIG. 1 is obtained, wherein the sacrificial region 16a has an approximately polygonal shape with a plurality of peripheral extensions 17, providing the sacrificial region 16a with the shape of a "toothed wheel", as can be seen in the view from above in FIG. 2, relative to the inductor area 6 alone. As can be seen in FIG. 2, the sacrificial region 16a has a slot 18 which extends radially, and inside which there extends part of the first connection line 16b, which is spaced from the sacrificial region 16a.

Figure 3:
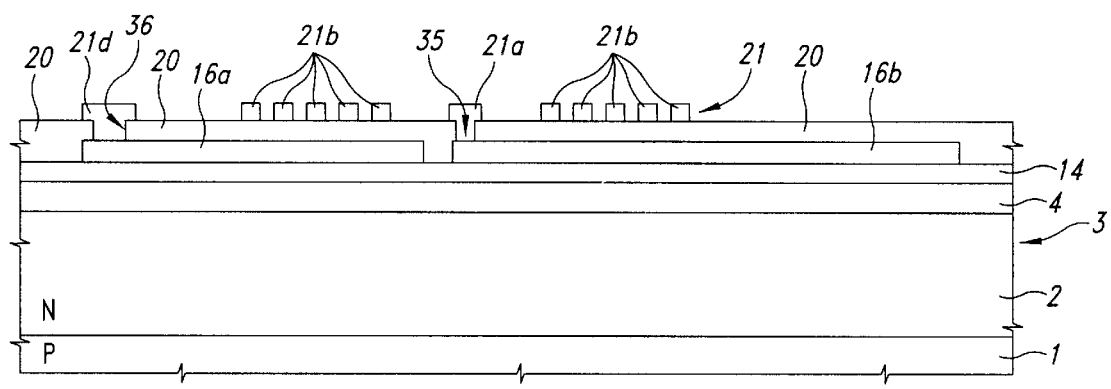
FIG. 3 is a transverse cross-section of the wafer in FIG. 1 in the inductor area and on an enlarged scale, in a subsequent production step.

Then an intermediate dielectric layer 20 (FIG. 3) is deposited and removed from the areas of the peripheral extensions 17, from the end of the first connection line 16b which is in the center of the sacrificial region 16a, and from the connection vias for the electrical components (not shown). In particular, at the end of the first connection line 16b, the intermediate dielectric layer 20 forms an aperture 35, and at the peripheral extensions 17 it forms apertures 36.

Figure 4:
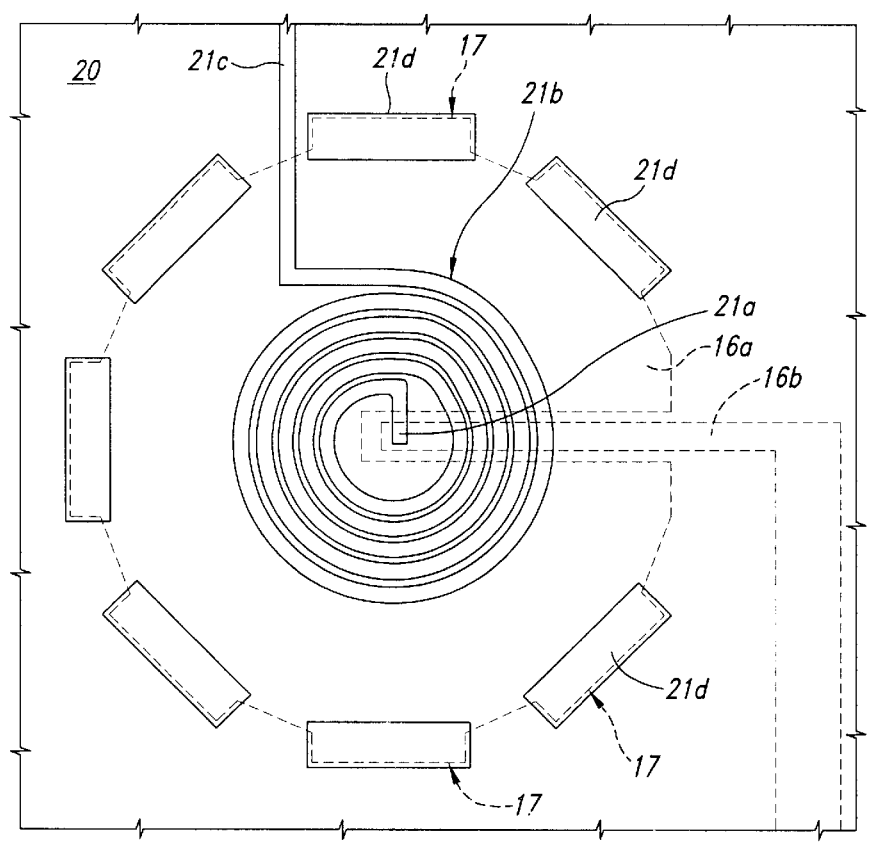
FIG. 4 is a see-through view from above of the wafer in FIG. 3.

A second metal layer 21 of Al—Si or Al—Si—Cu or Cu is then deposited. In particular for Al—Si or Al—Si—Cu, this second metal layer 21 is deposited by sputtering, whereas for copper, it is grown electrolytically. The second metal layer 21 is in direct contact with the first metal layer 16, in the areas in which the intermediate dielectric layer 20 has been removed, in particular at the apertures 36, the aperture 35, and where the vias (not shown) have been formed. Subsequently, the second metal layer 21 is shaped, and forms a contact region 21a extending inside the aperture 35; a coil 21b of the inductor extending, spiral-shaped, above the intermediate dielectric layer 20, from the contact region 21a towards the exterior; and a second connection line 21c extending without interruption from the coil 21b, as shown in FIG. 4, in which broken lines also represent the sacrificial region 16a and the first connection line 16b. In this step, in the apertures 36, etch regions 21d are formed, which are approximately in the shape of "plugs", providing the structure in FIG. 3; in addition (in a known and therefore not shown manner), a second electrical connection level of the circuit is formed.

Figure 5:
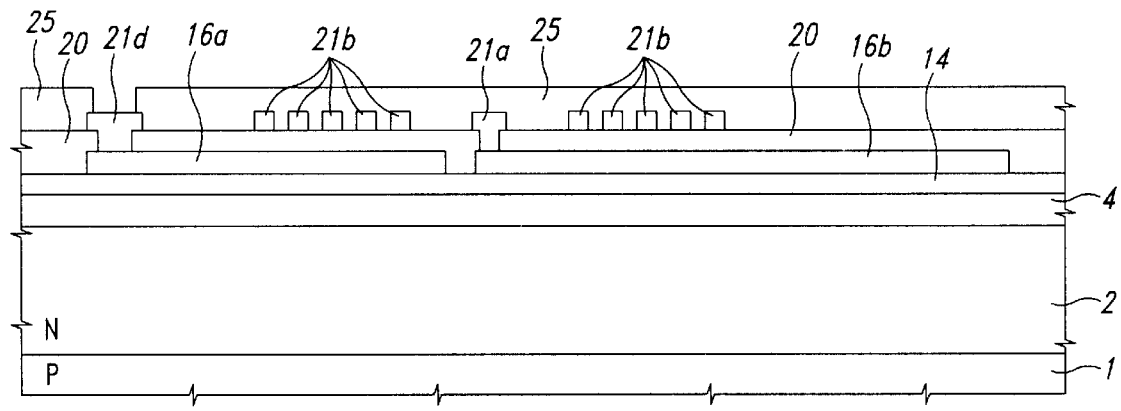
FIG. 5 is a cross-section similar to FIG. 3, in a subsequent step.
Figure 6:
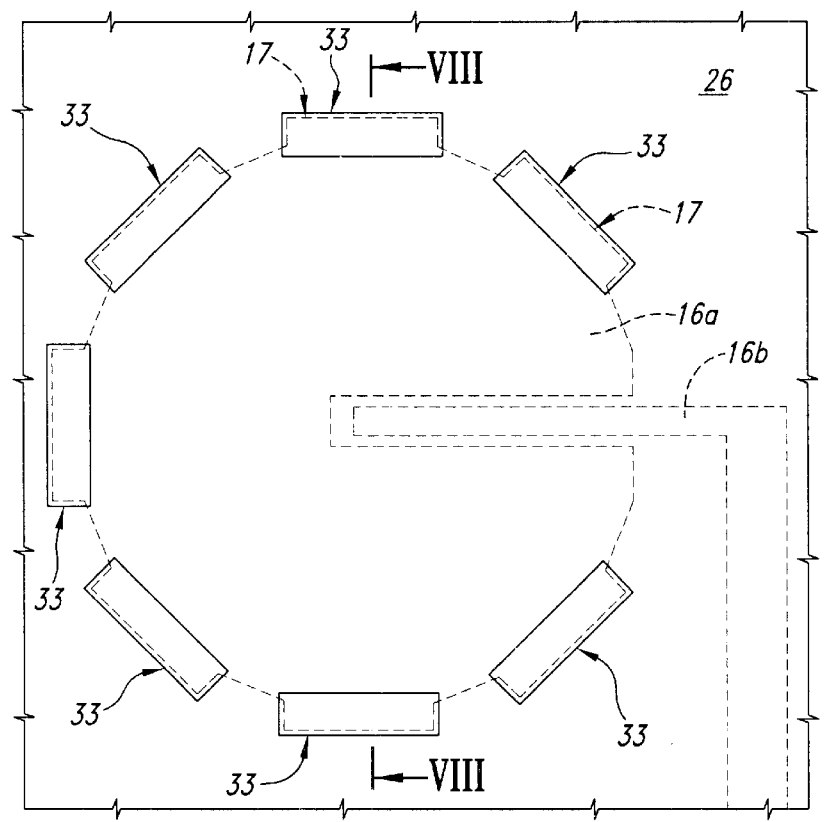
FIG. 6 is a see-through view from above of the wafer in FIG. 5.
Figure 7:
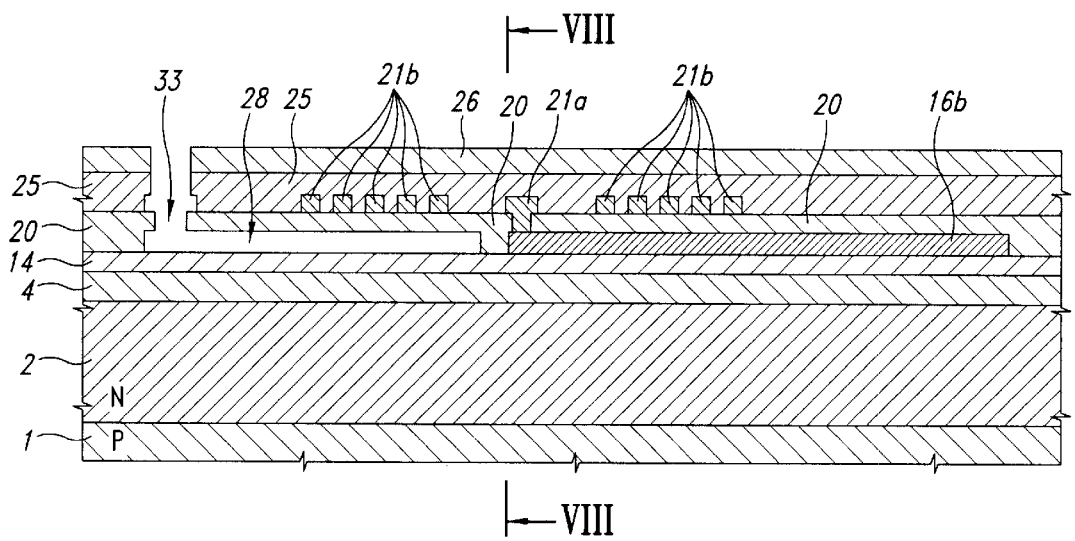
FIG. 7 is a cross-section similar to that in FIGS. 3 and 5, in a subsequent step.

Subsequently a passivation layer 25 of dielectric material is deposited and removed selectively at contact pads (not shown) of the circuit and at the etch regions 21d, which remain uncovered, as shown in FIG. 5. Then a protective layer 26, for example TEOS (tetraethylorthosilicate), with a thickness of 2000 A is deposited and removed at the etch regions 21d, forming apertures 33 which extend through the protective layer 26 and the passivation layer 25, as shown in FIG. 6, in which the sacrificial region 16a and the first connection line 16b are again represented by a broken line. The metal regions are then wet etched through the apertures 33; thus removing all the etch regions 21d and the sacrificial region 16a below the intermediate dielectric layer 20. Then the structure of FIG. 7 is obtained, the FIG. showing an air gap 28, the shape of which corresponds exactly to the above-described sacrificial region 16a which is shown in FIG. 2. At this stage, the protective layer 26 protects the passivation layer 25 against etching.

Figure 8:
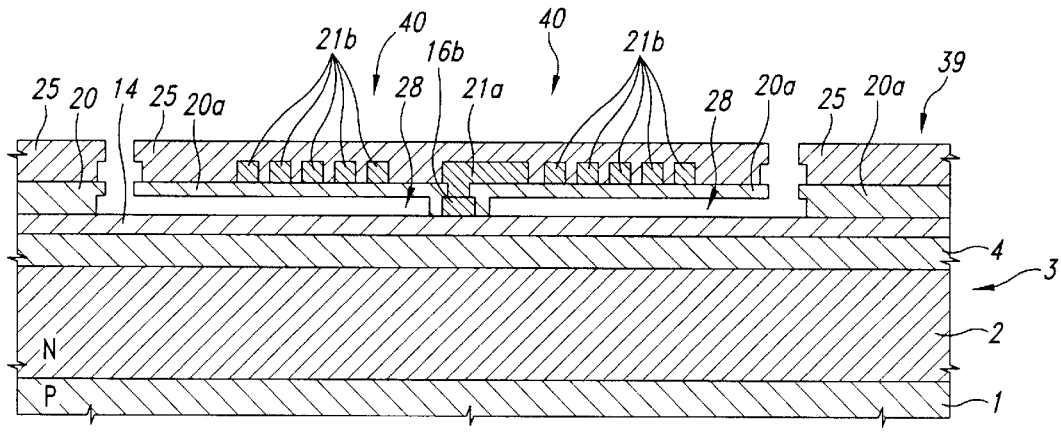
FIG. 8 is a transverse cross-section of the device at the end of production, seen along the cross-sectional plane VIII—VIII in FIG. 7.
Figure 9:
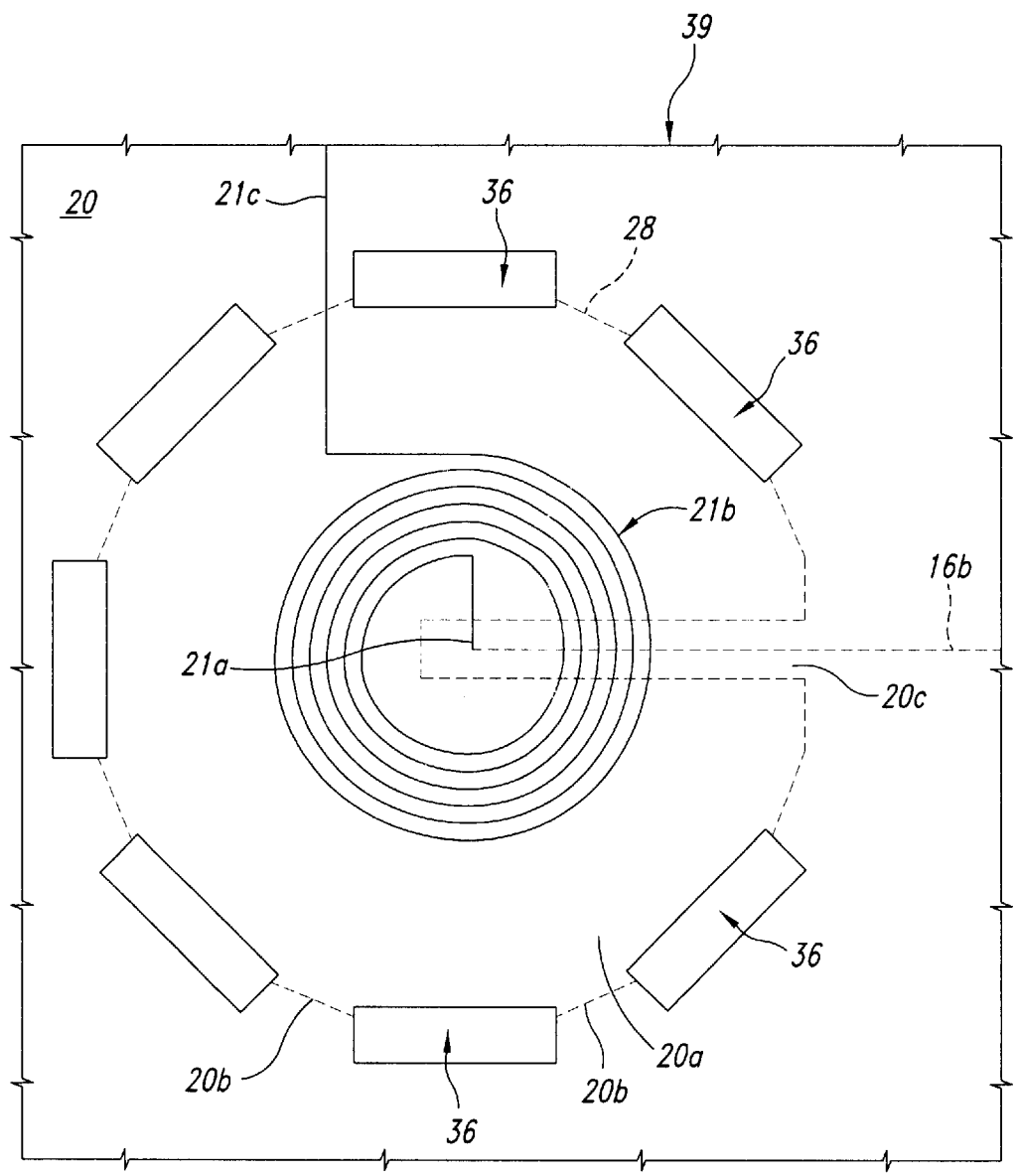
FIG. 9 is a view from above of the device in FIG. 8, with layers removed.

Finally, the protective layer 26 is removed from the entire surface (blanket removal). Then the final structure of FIG. 8 is obtained, wherein the coil (indicated at 40) of the inductor is carried by a bracket 20a formed from the intermediate dielectric layer 20, and is supported at the areas 20b which are delimited laterally by the apertures 36, as can be seen in FIG. 9, which shows a schematic view from above and on a reduced scale of the finished device, wherein the passivation layer 25 has been omitted and the periphery of the air gap 28 and the first connection line 16b are indicated by a broken line. As can be seen, the bracket 20a is also in contact with the wafer 3 at the narrow strip which surrounds the first connection line 16b (above the slot 18, and indicated as a portion of electrical isolation 20c).

This provides an integrated device 39, which comprises an integrated inductor 40, in addition to integrated electronic components such as the transistor 8. The integrated inductor 40 has a high quality factor, owing to the presence of an air gap, indicated at 28 in FIGS. 7 and 8, between the bracket 20a and the surface dielectric layer 14, and to the presence of a thick field oxide layer 4, which further reduces the coupling of the inductor and the substrate.

The production method described is compatible with the usual production processes used in the microelectronics industry, and thus has the advantages of reliability, controllability and repeatability which are typical of these processes. It requires only an additional mask for shaping the protective layer 26, compared with the standard processes with two metal levels, since the first metal level is also used to form the sacrificial region, and the second metal level is used to form the inductor; it therefore has costs which are comparable with, or only slightly higher than those of the standard processes.

Finally, it will be appreciated that many modifications and variants can be made to the inductor and the production process described and illustrated here, all of which come within the scope of the inventive context as defined in the attached claims.

What is claimed is:

1. An integrated inductor, comprising:
   a semiconductor material body;
   an insulating layer formed on the semiconductor material body,
   a coil of conductive material extending above and spaced away from said insulating layer by an air gap; and
   a bracket supporting the coil on said insulating layer, said bracket having a first support portion that supports the coil above said air gap and a second support portion extending from said coil to said insulating layer and from a central area to a peripheral area of said bracket, said second support portion including an electrical isolation portion that insulates peripheral portions of the coil from the semiconductor material body, wherein said electrical isolation portion is made of a dielectric material, and surrounds above and laterally an electrical connection line extending on said insulating layer, said connection line being on substantially a same level as said air gap and connected to a central terminal of said coil through a contact region extending through an aperture of said bracket.

2. The inductor according to claim 1 wherein said first support portion includes connection portions disposed peripherally on said bracket said connection portions contacting surrounding support regions formed on the semiconductor material body and being separated from one another by apertures connected to said air gap.

3. The inductor according to claim 1 wherein said insulating layer comprises a field oxide region extending above said semiconductor material body and below said air gap.

4. A semiconductor device having an inductor integrated on a semiconductor material body, said device comprising:
   an insulating layer formed on the semiconductor material body;
   a bracket extending above and spaced apart from said insulating layer by an air gap, said bracket being made of a dielectric material and being supported by the semiconductor material body through support regions; and
   a conductive coil placed over and supported by said bracket; wherein the bracket includes an electrical isolation portion extending from said coil to said insulating layer and from a central area to a peripheral area of said bracket thereby insulating the coil from the semiconductor material body, said electrical isolation portion being made of a dielectric material, wherein said electrical isolation portion surrounds above and laterally an electrical connection line extending on said insulating layer from the central area to the peripheral area of said bracket, said connection line being on substantially a same level as said air gap and connected to a central terminal of said coil by a contact region extending through a contact aperture if said bracket.

5. The device of claim 4 wherein said support regions include peripheral support regions that comprise connection portions disposed peripherally on said bracket and separated from one another by apertures connected to said air gap.

6. The device of claim 4, wherein the insulating layer includes a dielectric region extending above said semiconductor material body and below said air gap.

7. The device of claim 6 wherein said insulating layer comprises:
   a field oxide region deposited over the semiconductor material body; and
   a dielectric layer deposited over said field oxide region.

8. The device of claim 7 wherein said dielectric layer is a BPSG layer.

9. A semiconductor device having an inductor integrated on a semiconductor material body, said device comprising:
   a semiconductor material body;

a bracket that includes a bracket portion and a radial support region, the bracket portion being spaced away from the semiconductor material body by an al gap, said bracket portion being on the radial support region that extends from the bracket portion to the semiconductor material body from a central portion of the bracket portion to a peripheral portion of the bracket portion;

an electrical connection line positioned substantially on a same level as said air gap and along the length of the radial support region between the bracket portion and the semiconductor material body;

a conductive coil deposited over and supported by the bracket; and an electrical contact formed within tile radial support region between the electrical connection line and the conductive coil at the central portion of the bracket portion.

10. The semiconductor device recited in claim 9 wherein the radial support region and the bracket portion are each formed of a dielectric material.

11. The semiconductor device recited in claim 9, further comprising:

a plurality of peripheral support regions extending between a peripheral edge of the bracket portion and surrounding support regions formed on said semiconductor material body.

12. The semiconductor device recited in claim 11 wherein the peripheral support regions are regularly spaced along the peripheral edge of the bracket portion and interspersed by air gaps.

* * * * *

UNITED STATES PATENT AND TRADEMARK OFFICE
CERTIFICATE OF CORRECTION

PATENT NO.   : 6,437,418 B1
DATED        : August 20, 2002
INVENTOR(S)  : Paolo Ferrari et al.

It is certified that error appears in the above-identified patent and that said Letters Patent is hereby corrected as shown below:

Column 4,
Line 50, "contact aperture if said bracket." should read as -- contact aperture of said bracket. --.

Column 5,
Line 3, "by an al gap," should read as -- by an air gap, --.
Lines 15 and 16, "within tile radial support region" should read as -- within the radial support region --.

Signed and Sealed this

Twenty-eighth Day of January, 2003

JAMES E. ROGAN
*Director of the United States Patent and Trademark Office*